United States Patent [19]

Min et al.

[11] 4,409,555

[45] Oct. 11, 1983

[54] QUADRATURE STEPWAVE FREQUENCY CONVERTER

[76] Inventors: Mart V. Min, ulitsa Ladva, 26; Toomas E. Parve, bulvar Ryannaku, 3, kv. 7; Khyarmo E. Khyarm, ulitsa Silla, 2, kv. 2; Toom A. Pungas, Syspruse pst, 219, kv. 3, all of Tallin, U.S.S.R.

[21] Appl. No.: 293,632

[22] PCT Filed: Jul. 31, 1981

[86] PCT No.: PCT/SU80/00121

§ 371 Date: Aug. 4, 1981

§ 102(e) Date: Aug. 4, 1981

[87] PCT Pub. No.: WO81/01762

PCT Pub. Date: Jun. 25, 1981

[30] Foreign Application Priority Data

Dec. 11, 1979 [SU] U.S.S.R. .............................. 2845551

[51] Int. Cl.³ .................. H03B 19/00; H03K 5/00
[52] U.S. Cl. ...................................... 328/14; 307/262; 307/529; 340/347 DA
[58] Field of Search .................. 328/14; 307/261, 262; 340/347 DA, 347 M

[56] References Cited

U.S. PATENT DOCUMENTS 3,728,719  4/1973  Fish ............................. 340/347 DA
3,747,088  7/1973  Pastoriza ..................... 340/347 DA
4,336,526  6/1982  Weir ............................ 340/347 DA
4,336,528  6/1982  Kane ........................... 340/347 DA

FOREIGN PATENT DOCUMENTS 446073  10/1974  U.S.S.R. .

OTHER PUBLICATIONS

V. S. Gutnikov Article (Integrated Electronics in Measuring Techniques) Publ. in 1974 by "Energiya" and Translation.
Article A Sine Wave Digital Generator by Karl Heinz Muller, Elektronik 1975 Heft 12, p. 414 and Translation.

Primary Examiner—John S. Heyman
Assistant Examiner—Timothy P. Callahan
Attorney, Agent, or Firm—Lilling & Greenspan

[57] ABSTRACT

A quadrature stepwave frequency converter comprises two variable-gain circuits, each connected to a sign reversing circuit adapted to reverse the sign of the gain. The absolute value of a converter gain depends on the number of the control inputs of the variable-gain circuits, at which binary signals have changed in a certain direction. The converter further comprises a sequencer 9 having two outputs respectively connected to the control inputs of the sign reversing circuits and its remaining outputs connected to the control inputs of the variable-gain circuits, so that the instants of changes in the binary signals at the mutually corresponding control inputs of different variable-gain circuits coincide.

5 Claims, 4 Drawing Figures

QUADRATURE STEPWAVE FREQUENCY CONVERTER

FIELD OF THE INVENTION

The present invention relates to devices for converting electrical signals of one frequency to electrical signals of another frequency, and more particularly to quadrature stepwave frequency converters.

BACKGROUND OF THE INVENTION

The present invention can most advantageously be used in quadrature harmonic oscillators, synchronous detectors and devices for measuring the phase of an electrical signal against the background of noise.

A quadrature stepwave frequency converter is a device having two outputs and provided with one or two inputs for receiving the signals to be converted and with control inputs supplied with binary control signals so that the gain for the signal transmitted from the input of the device to its one output varies according to a predetermined periodic step function and the gain for the signal transmitted from the input of the device to its other output varies according to a periodic step function shifted in phase by 90° in relation to the function characterizing variation of the gain for the signal transmitted from the input of the device to its first output.

Quadrature stepwave frequency converters must provide, on the one hand, a precise agreement between the law of variation of each of the gains and the corresponding step function waveform, and, on the other hand, a precise phase shift of 90° between the curves characterizing variations of the gain.

DESCRIPTION OF THE PRIOR ART

Known in the art is a stepwave frequency converter (cf. U.S. Pat. No. 3,517,298) comprising a sequencer and two circuits having variable gains and connected in parallel, each of said variable-gains circuits having a plurality of control inputs for changing the absolute value of the gain provided by the circuit upon a change in the binary signals applied to its control inputs so that a change in the value of the binary signal applied to a control input of a circuit causes it to change its gain by a predetermined value corresponding to this control input and in a direction determined by the direction of the change in the binary signal and so that the same changes in the binary signals at the mutually corresponding control inputs of different circuits cause the circuits to change their gains by the same values and in the same direction. Some outputs of the sequencer are respectively connected to the control inputs of one variable gain circuits for supplying said control inputs with binary signals periodically changing their values so that the binary signal applied to a first control input changes its value at regular time intervals and the binary signal applied to each next-in-order control input changes in a direction providing an increase in the circuit gain after a change in a similar direction in the binary signal at the preceding-in-order control input and changes in a direction providing a decrease in the circuit gain before a change in a similar direction in the binary signal at the preceding-in-order control input. The other outputs of the sequencer are respectively connected to the control inputs of the other variable gain circuit for supplying said control inputs with binary signals shifted in phase by 180° with respect to the binary signals applied to the corresponding control inputs of the first circuit. The input signals are applied to the input of one of the variable gain circuits directly and to the input of the other circuit via an inverting amplifier, the output signals of both the circuits being summed.

A change in the value of the binary signal at the first control input of one of the circuits in the direction providing an increase in gain causes the absolute value of the total gain to increase. The subsequent changes in the binary signals at the other control inputs of this circuit produce a stepped increase in the absolute value of the gain for the input signal up to a maximum value. Then the values of the binary signals at the control inputs of this circuit change in the opposite direction, the changes in the binary signals occurring in that case in reversed sequence so that the absolute value of the gain for the input signal decreases in steps to a minimum value. Thereupon the binary signals at the control inputs of the other circuit change their values in the same fashion producing a similar stepped variation in the absolute value of the gain for the input signal, with the sign of the gain, however, being reversed. The values of the gain changes corresponding to different control inputs and the time periods between the instants of changes in the binary signals at the control inputs are chosen so that the variation of the gain for the input signal in time proceeds according to a function representing a stepped sine wave wherein the harmonic components of the lower orders are effectively suppressed.

As pointed out in U.S. Pat. No. 3,517,298, such a converter can be used as a quadrature frequency converter, in which case the sequencer must be provided with switches adapted to change upon switching the phase of the binary control signals supplied to the control inputs of the variable gain circuits by 90°. This makes it possible to alternately transmit the input signal with gains shifted in phase by 90° with respect to each other.

The advantage of such a converter originate from the fact that the absolute value of the gain for the input signal is changed in the direction of increase or decrease in gain by increasing or decreasing the number of the control inputs supplied with binary signals having corresponding values so that, when the binary signal applied to one of the control inputs is changed, there is no need for a simultaneous change in the signal at any other control input. This avoids distortions in the output signal waveform arising if binary signals at two control inputs are changed at once, said distortions being due to lack of coincidence between the instants of corresponding changes in the gain because such a lack of coincidence causes the gain to sharply increase or fall to zero during the interval between said instants.

If the converter described above is used as a quadrature frequency converter, the accuracy to which the gain is shifted in phase upon the seitching of the switches in the sequencer is determined by the accuracy to which the phase shift of 90° is provided between the control signals. To obtain such a phase shift between the control signals, however, additional logic elements must be connected to the outputs of the sequencer when the switches are in one position and disconnected from the outputs of the sequencer when the switches are in the other position. These additional logic elements introduce additional phase shifts, thereby reducing the accuracy of the phase shift between the control signals and hence between the gains.

The prototype of the present invention is a quadrature stepwave frequency converter (cf. U.S.S.R. Author's Certificate No. 446,073 published Oct. 5, 1974) comprising a two-output device having an input for receiving the signal to be converted and a plurality of control inputs for changing the gains for the signals transmitted from the input of the device to its outputs upon a change in the values of the binary signals at the control inputs, and a sequencer having its outputs respectively connected to the control inputs for applying binary signals thereto so as to vary the gain for the signal transmitted from the input of the device to its one output according to a step variable function approximating a sine wave and to vary the gain for the signal transmitted from the input of the device to its other output according to a step variable function approximating a cosine wave. Said two-output device comprises two adders and a plurality of controlled switching circuits, the outputs of the adders being the outputs of the device and the control inputs of the switching circuits being the control inputs of the device. The inputs of the adder are respectively connected to corresponding inputs of the other adder, each pair of the interconnected inputs of dirrerent adders being supplied with the input signal via the corresponding switching circuit.

In such a converter a change in the value of the binary signal at a control input leads to simultaneous change in the gains of both the adders. The sequence of commutation of the switching circuits and the gains of the adders across their inputs are chosen so that the gain for the signal transmitted from the converter input to the output of one adder varies with time according to the sine function and the gain for the signal transmitted form the converter input to the output of the other adder varies with time according to the cosine function, i.e. is shifted in phase by 90° with respect to the gain for the signal transmitted from the converter input to the output of the output of the first adder.

Such a frequency converter ensures a very high accuracy of the phase shift between the variations of the gains for the input signal because a change in both the gains results from a change in the binary signal at the same control input. However, to obtain a phase shift of 90° between the gains with the aid of such a frequency converter, the closure of each next-in-turn switching circuit must be accompanied by the opening of the preceding one, i.e. to change either gain, binary signals at two control inputs must be changed at once. For the reason stated above, this leads to distortions in the signals at the outputs of the frequency converter when binary signals at the control inputs are changed.

SUMMARY OF THE INVENTION

The principal object of the present invention is to provide a quadrature stepwave frequency converter ensuring an accurate phase shift of 90° between the converter gains, which is designed so as to ensure a change in either of the gains by changing only one of the binary signals controlling the variation of said gain, and thus to eliminate distortions resulting from the necessity to simultaneously change two binary signals controlling the variation of said gain.

With this principal object in view, there is proposed a quadrature stepwave frequency converter comprising a two-output device having a plurality of control inputs for changing the gains for the signals transmitted from its input to its outputs upon a change in the values of the binary signals at the control inputs, and a sequencer having its outputs connected to the control inputs of the two-output device for applying binary signals to said control inputs so as to vary the gain for the signal transmitted from the input of the device to its one output according to a step variable function approximating a sine wave and to vary the gain for the signal transmitted from the input of the device to its other output according to a step variable function approximating a cosine wave. According to the invention, said two-output device comprises two variable-gain circuits each having N control inputs forming a separate group of the control inputs of the device and respectively corresponding to the control inputs of the other variable-gain circuit for changing the absolute value of the gain for the signal transmitted from the input of the device to its one output upon a change in the value of the binary signal applied to a control input of one variable-gain circuit and the absolute value of the gain for the signal transmitted from the input of the device to its other output upon a change in the value of the binary signal applied to a control input of the other variable-gain circuit so that a change in the value of the binary signal applied to a control input of a variable-gain circuit produces a change in the absolute value of the corresponding gain by a predetermined value corresponding to this control input and in a direction determined by the direction of the change in the binary signal and so that changes in the binary signals applied to the control inputs of one variable-gain circuit produce changes in the corresponding gain which are proportional to the changes in the other gain produced by changes in the binary signals at the corresponding control inputs of the other circuit. Two sign reversing circuits are provided one of which is connected to one variable-gain circuit and the other is connected to the other variable-gain circuit. Each of the sign reversing circuits has a control input forming another control input of the two output device for reversing upon a change in the value of the binary signal at the control input of the sign reversing circuit the sign of the gain the absolute value of which is varied by means of the variable-gain circuit connected to this sign reversing circuit. The sequencer has two sign control outputs, one of which is connected to the control input of one sign reversing circuit and the other is connected to the control input of the other sign reversing circuit for applying to said control inputs binary signals, each changing its value at regular intervals and which are shifted in phase with respect to each other by 90°, and a plurality of gain value control outputs connected to the control inputs of the variable-gain circuits for changing the value of the binary signal applied to each of the control inputs of a first variable-gain circuit first in a direction providing an increase in the gain absolute value and then in a direction providing a decrease in the gain absolute value during each time period between two successive changes in the binary signal at the control input of the sign reversing circuit connected to the first variable-gain circuit so that a change in the binary signal at each next-in-order control input of this variable gain circuit in a direction providing an increase in the gain absolute value occurs after a change in a similar direction in the binary signal at the preceding-in-order control input of this circuit, while a change in the binary signal in a direction providing a decrease in the gain absolute value occurs before a change in a similar direction in the binary signal at the preceding-in-order control input of this circuit, and for changing the binary signals applied to the control inputs of the second variable-gain circuit so that the instant of change in the value of the binary signal at that control input of the second variable-gain circuit which corresponds to the "k"th-in-order control input of the first circuit in a direction providing a change in the gain absolute value in one sense coincides with the instant of change in the value of the binary signal at the (N−k+I)th-in-order control input of the first circuit in a direction providing a change in the gain absolute value in the opposite sense.

Coincidence between the instants at which the binary signals controlling the variations of the absolute values of both the gains are changed makes it possible to eliminate the necessity to use additional logic elements for providing the phase shift between the binary signals controlling the absolute value of one of the gains in relation to the binary signals controlling the variation of the absolute value of the other gain and thus to eliminate the phase shifts introduced by such additional logic elements and to ensure threby an accurate phase shift of 90° between the gains of the quadrature step-wave frequency converter. At the same time, a change in each of the gains is provided by changing only one of the binary signals controlling the variation of said gain, i.e. by changing the binary signal at one of the control inputs of the corresponding variable-gain circuit. This provides elimination of distortions in the signal waveforms at the outputs of the frequency converter when the gains are changed.

According to one embodiment of the invention, each of the variable-gain circuits can comprise N controlled two-position electronic switches, each having a control input to change its position upon a change in the value of the binary signal at its control input, the control inputs of the switches of each variable-gain circuit being respectively the control inputs of this circuit, each of the switches being adapted to change upon switching the absolute value of the corresponding gain by a value corresponding to the variable-gain circuit control input which is the control input of that switch and being designed so that changes in the same directions in the values of the binary signals at the control inputs of the switches of different circuits produce changes in the same directions in the absolute values of the corresponding gains. The sequencer has N direct gain value control outputs respectively connected to the control inputs of the first variable-gain circuit and N inverted gain value control outputs respectively connected to the control inputs of the second variable-gain circuit so that the control input of the second variable-gain circuit corresponding to the "k"th-in-order control input of the first variable-gain circuit is supplied with a binary signal inverted in relation to the binary signal supplied to the (N−k+I)-th-in-order control input of the first circuit.

The frequency converter so designed makes it possible to use as control signals the signals produced at the direct and inverted outputs of the same logic elements of the sequencer, such as flip-flops, and thus to ensure an accurate phase shift between the gains due to a small time difference between the instants of changes in the signals at the direct and inverted outputs of the same logic element.

According to another embodiment of the invention, each of the switches can have an additional control input for application of a binary signal thereto inverted in relation to the binary signal applied to its other control input. In this case the additional control inputs of the switches are connected to the outputs of the sequencer so that the additional control input of the switch, the other control input of which is the "k"th-in-order control input of the first variable-gain circuit, is connected to the sequencer output connected to the control input of the second variable-gain circuit corresponding to the (N−k+I)th-in-order control input of the first circuit, and the additional control input of the switch, the other control input of which is the control input of the second gain-variable circuit corresponding to the "k"th-in-order control input of the first gain-variable control circuit, is connected to the sequencer output connected to the (N−k+I)th-in--order control input of the first circuit.

According to still another embodiment of the invention, each of the variable-gain circuits comprises N controlled two-position electronic switches each having a control input to change its position upon a change in the value of the binary signal at its control input, the control inputs of the switches being respectively the control inputs of that circuit. Each of the switches is adapted to change upon switching the absolute value of the corresponding gain by a value corresponding to the variable-gain circuit control input which is the control input of this switch and being designed so that changes in the same directions in the values of the binary signals at the control inputs of the switches of different circuits produce changes in the absolute values of the corresponding gains in mutually opposite directions. The sequencer has N gain value control outputs respectively connected to the control inputs of both the variable-gain circuits so that the control input of the second variable-gain circuit, corresponding to the "k"th-in-order control input of the first variable-gain circuit, is connected to the sequencer output connected to the (N−k+I)th-in-order control input of the first circuit.

The frequency converter so designed makes it possible to provide a still higher accuracy of the phase shift between the gains because the time difference between the instants of changes in the absolute values of the gains is determined in such a case by the difference in the switching times of the electronic switches of different circuits. If proper electronic switches are used, this difference can be made even smaller than the time difference between the instants of changes in the signals at the direct and inverted outputs of a logic element.

To produce binary signals supplied to the control inputs of the variable-gain circuits and of the sign reversing circuits so as to ensure variations in the gains shifted in phase by 90°, the sequencer may comprise two flip-flops, each having a clock input and a control input for reversing the state of a flip-flop upon application of a signal to its clock input on condition that its control input is supplied with a permitting signal; a reversible shift register including a chain of N stages and having two information inputs respectively formed by the inputs of the two end stages of the register and supplied with constant signals respectively corresponding to the opposite values of a binary signal, a control input and a clock input for sequentially shifting a signal from one of the end stages to the other end stage in a direction determined by the value of the binary signal at the control input of the register; two logic gates having their outputs respectively connected to the control inputs of the flip-flops, one input of one logic gate being connected to the output of one end stage of the shift register and one input of the other logic gate being connected to the output of the other end stage of the shift register; an Exclusive OR circuit having its inputs respectively connected to the outputs of the flip-flops and its output connected to the control inputs of the shift register for reversing upon a change in the value of the binary signal at the output of either of the flip-flops the direction of shift in the shift register towards the end stage the output of which is connected to the logic gate connected to the other flip-flop; and a clock pulse generator having its output connected to the clock inputs of the flip-flops and of the register. In this case another input of each logic gate is connected to the output of the Exclusive OR circuit for applying a permitting signal to the control input of the flip-flop connected to this logic gate when the value of the binary signal at the output of the register end stage connected to this logic gate is determined by the signal at the input of the other end stage and the signal at the output of the Exclusive OR circuit corresponds to the direction of shift in the register towards the end stage the output of which is connected to that logic gate. The outputs of the flip-flops are respectively the sign control outputs of the sequencer and the outputs of the register stages are respectively the gain value control outputs of the sequencer and are connected to the control inputs of the variable-gain circuits so that the "k"th-in-order control input of the first variable-gain circuit is connected to the output of the register stage which is "k"th in order counting from one end stage and the corresponding control input of the second variable-gain circuit is connected to the register stage which is "k"th in order counting from the other end stage.

The invention is further explained by a detailed description of its preferred embodiments with reference to the accompanying drawings.

DETAILED DESCRIPTION OF THE INVENTION

Figure 1:
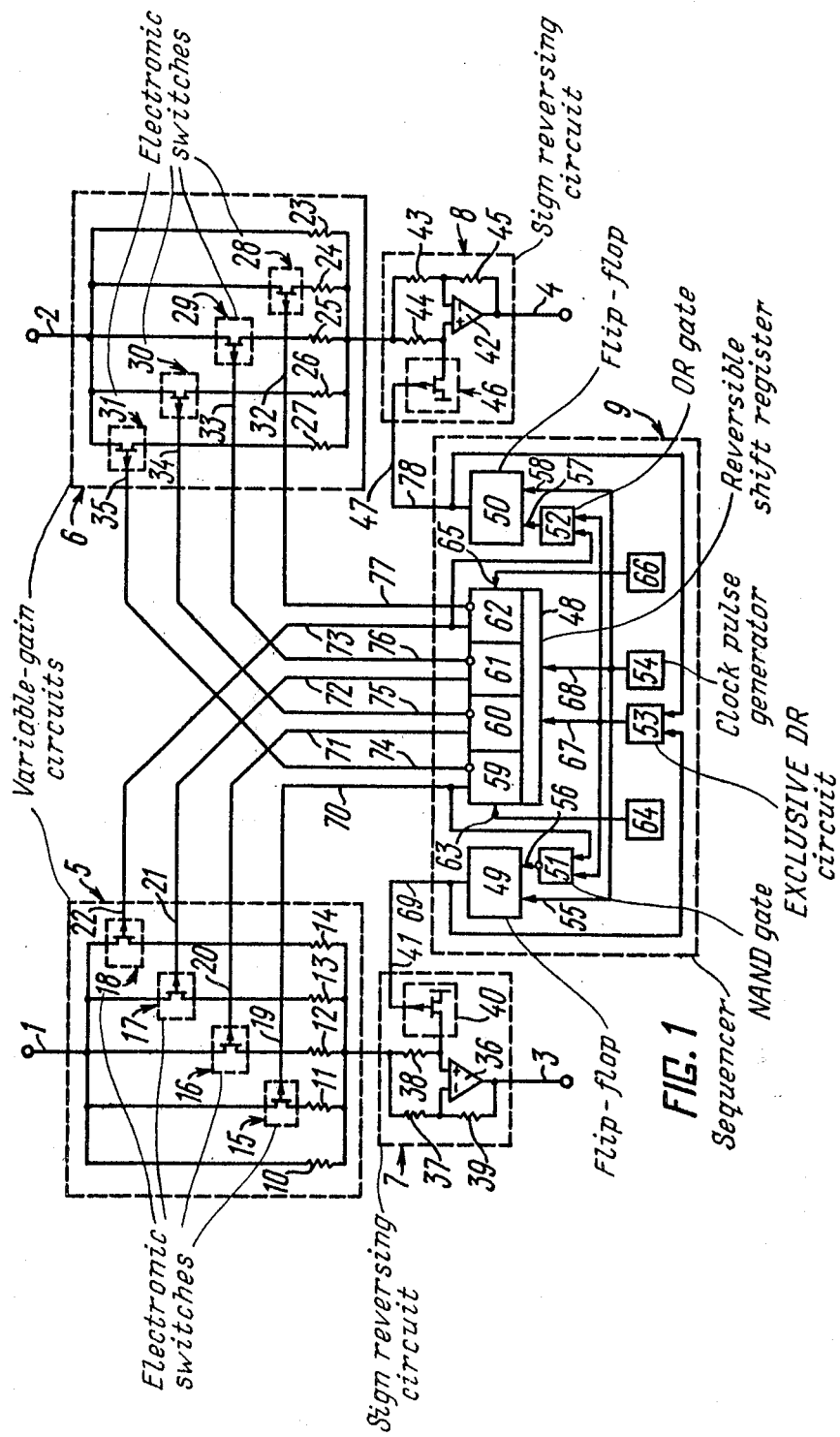
FIG. 1 is a block diagram of a quadrature stepwave frequency converter, according to the invention.

Referring to FIG. 1, the quadrature stepwave frequency converter comprises a two-output device having two inputs 1 and 2, which are the inputs of the frequency converter, and two outputs 3 and 4 which are the outputs of the frequency converter. It includes variable-gain circuits 5 and 6 and sign reversing circuits 7 and 8. The frequency converter further comprises a sequencer 9.

The variable-gain circuit 5 comprises five circuits connected in parallel, one of which includes a resistor 10 and the others including resistors 11,12,13, and 14, respectively. The variable-gain circuit 5 further comprises controlled two-position electronic switches 15,16, 17 and 18 respectively connected in series with the resistors 11,12,13 and 14. The electronic switches 15,16, 17 and 18 have control inputs 19,20,21 and 22, respectively, representing the control inputs of the variable-gain circuit 5.

The variable gain circuit 6 comprises five circuits connected in parallel, one of which includes a resistor 23 and the others including resistors 24,25,26 and 27, respectively. The variable gain circuit 6 further comprising controlled two-position electronic switches 28,29, 30 and 31 respectively connected in series with the resistors 24,25,26 and 27. The electronic switches 28,29, 30 and 31 have control inputs 32,33,34 and 35, respectively, representing the control inputs of the variable-gain circuit 6.

The switches 15–18 and 28–31 are identical in design and are constituted by p-channel field-effect transistors connected in series with the corresponding resistors 11–14 and 24–27, the gates of the transistors being the control inputs 19–22 and 32–35 of the corresponding switches 15–18 and 28–31.

The sign reversing circuit 7 comprises a differential amplifier 36, the output of the amplifier 36 being the output 3 of the frequency converter. The inverting and the non-inverting inputs of the amplifier 36 are respectively connected via resistors 37 and 38 to the common point of the parallel circuits including the resistors 10–14 and the switches 15–18. the circuit 7 further comprises a resistor 39 having a resistance equal to that of the resistor 37 and connected between the output and the inverting input of the amplifier 36. A controlled electronic switch 40 is constituted by a p-channel field-effect transistor connected between the non-inverting input of the amplifier 36 and the ground, the gate of said transistor being the control input of the switch 40 and representing a control input 41 of the sign reversing circuit 7.

The sign reversing circuit 8 comprises a differential amplifier 42, the output of the amplifier 42 being the output 4 of the frequency converter. The inverting and non-inverting inputs of the amplifier 42 are respectively connected via resistors 43 and 44 to the common point of the parallel circuits including the resistors 23–27 and the switches 28–31. The circuit 8 further comprises a resistor 45 having a resistance equal to that of the resistor 43 and connected between the output and the inverting input of the amplifier 42. A controlled electronic switch 46 is constituted by a p-channel field-effect transistor connected between the non-inverting input of the amplifier 42 and the ground, the gate of said transistor being the control input of the switch 46 and representing a control input 47 of the sign reversing circuit 8.

The sequencer 9 comprises a reversible shift register 48, flip-flops 49 and 50, two logic gates one of which is a NAND gate 51 and the other of which is an OR gate 52, an Exclusive OR circuit 53, and a clock pulse generator 54. The flip-flop 49 has a clock input 55 connected to the output of the clock pulse generator 54, and a control input 56 connected to the output of the NAND gate 51. The flip-flop 50 has a control input 57 connected to the output of the OR gate 52, and a clock input 58 connected to the output of the clock pulse generator 54. The flip-flops 49 and 50 may be JK flip-flops, the interconnected J and K inputs in each of the flip-flops constituting its control input. The inputs of the Exclusive OR circuit 53 are respectively connected to the outputs of the flip-flops 49 and 50.

The shift register 48 comprises a chain of four stages 59, 60, 61 and 62, the stages 59 and 62 being the end stages of the register 48. The stage 60 is connected between the stages 59 and 61, while the stage 61 is connected between the stages 60 and 62. One of the inputs of the end stage 59 constitutes an information input 63 of the register 48 and is connected to a source 64 of a signal of logical zero. One of the inputs of the end stage 62 constitutes another information input 65 of the register 48 and is connected to a source 66 of a signal of logical one. The register 48 has a control input 67 connected to the output of the Exclusive OR circuit 53 and a clock input 68 connected to the output of the clock pulse generator 54. Each of the register stages 59–62 has a direct output and an inverted output constituting one pair of the register outputs, at which signals of logical one and zero are respectively developed when a signal of logical one is applied to the corresponding stage. The register 48 may be made according to one of the known circuits, such as described on page 62 in the book by V. S. Gutnikov entitled "Integralnaya Elektronika v Izmeritelnykh Priborakh" published in 1974 by "Energiya", Leningrad, U.S.S.R. In such a case the flip-flop of each register stage may be a D flip-flop having a direct output and an inverted output respectively representing the direct and inverted outputs of the corresponding stage.

The direct output of the end stage 59 of the register 48 is connected to another input of the NAND gate 51, while the direct output of the end stage 62 is connected to another input of the OR gate 52. The output of the flip-flop 49 constitutes the output 69 of the sequencer 9 and is connected to the control input 41 of the sign reversing circuit 7. The direct outputs of the register stages 59,60,61 and 62 respectively constitute the direct outputs 70,71,72 and 73 of the sequencer 9 and are respectively connected to the control inputs 19,20,21 and 22 of the switches 15,16,17 and 18, while the inverted outputs of the stages 59,60,61 and 62 respectively constitute the inverted outputs 74, 75,76 and 77 of the sequencer 9 and are respectively connected to the control inputs 35,34,33 and 32 of the switches 31,30,29 and 28. The output of the flip-flop 50 constitutes the output 78 of the sequencer 9 and is connected to the control input 47 of the sign reversing circuit 8.

Figure 2:
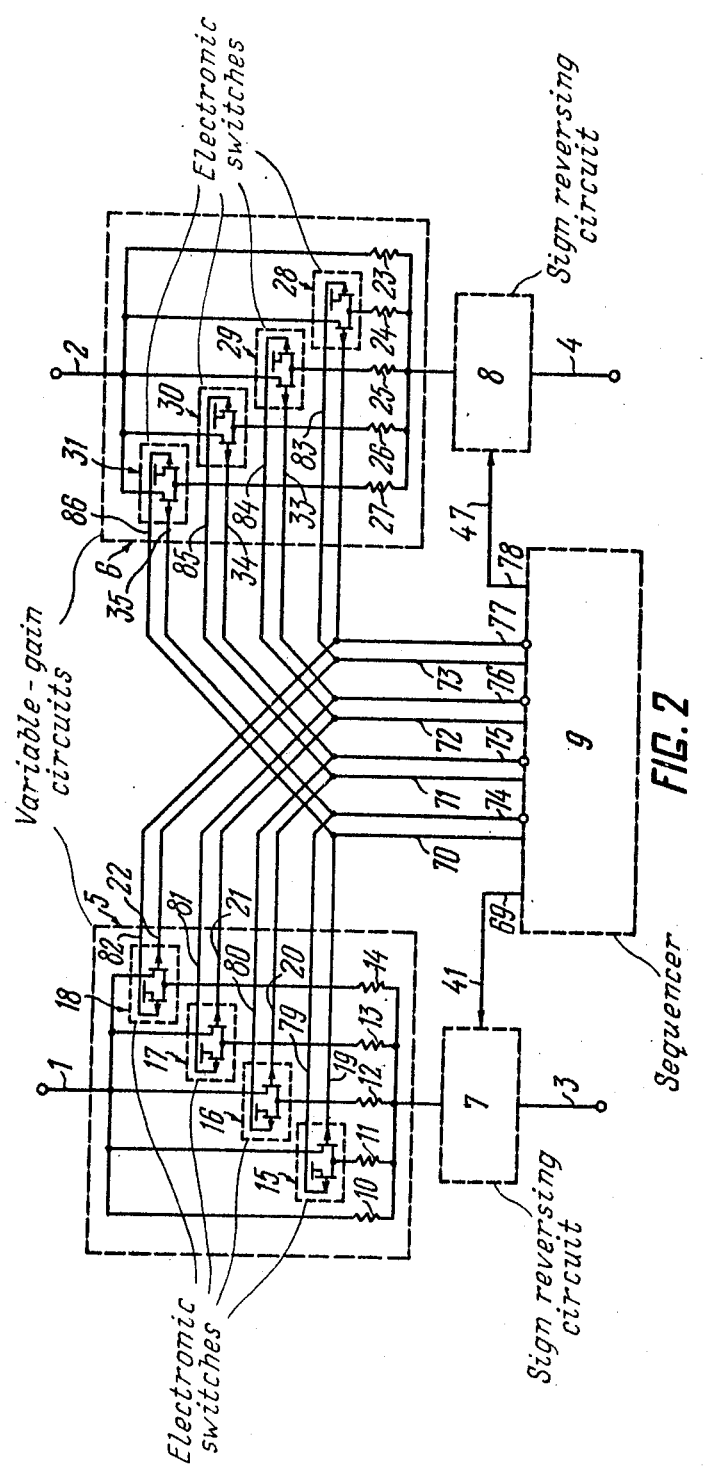
FIG. 2 is a block diagram of the quadrature stepwave frequency converter, accoding to another embodiment of the invention.

FIG. 2 is a block or schematic diagram of the frequency converter wherein the switches 15–18 and 28–31 are identical in design, each of the switches 15–18 and 28–31 having two control inputs to be supplied with antiphase binary control signals. Referring to FIG. 2, each of the switches 15–18 and 28–31 comprises two p-channel field-effect transistors, a first of which is connected in series with the resistors 11–14 and 24–27 which is connected in series with the respective switch, the second transistor being connected between the ground and the point interconnecting the first transistor and the corresponding resistor. The gates of the first transistors form the control inputs 19–22 and 32–35 of the corresponding switches 15–18 and 28–31. The gates of the second transistors of the switches 15,16,17 and 18 respectively constitute additional control inputs 79,80,81 and 82, while the gates of the second transistors of the switches 28,29,30 and 31 respectively constitute additional control inputs 83,84,85 and 86. The control inputs 79,80,81 and 82 are respectively connected to the inverted outputs 74,75,76 and 77 of the sequencer 9, while the control inputs 83,84,85 and 86 are respectively connected to its direct outputs 73, 72,71 and 70.

Figure 3:
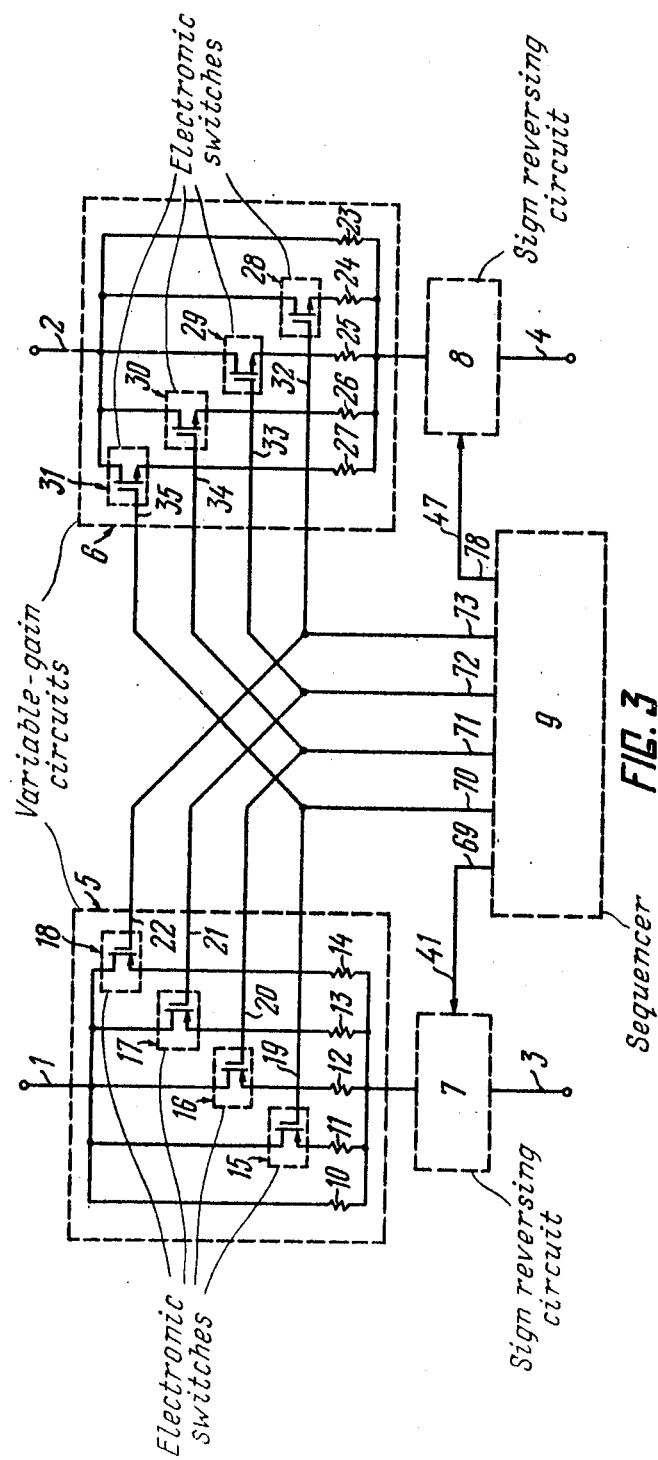
FIG. 3 is a block diagram of the quadrature stepwave frequency converter, according to another embodiment of the invention.

FIG. 3 is a block or schematic diagram of the frequency converter wherein the switches 15–18 and 28–31 are designed so that changes in the same direction in the values of the binary signals at their control inputs causes the switches 15–18 to switch in a direction opposite to the direction of switching of the switches 28–31.

Referring to FIG. 3, the switches 15–18 are constituted by p-channel insulated gate field-effect transistors connected in series with the corresponding resistors 11–14, while the switches 28–31 are constituted by n-channel insulated gate field-effect transistors connected in series with the corresponding resistors 24–27. The gates of the transistors constituting the switches 15,16,17 and 18 respectively represent their control inputs 19,20,21 and 22 and are respectively connected to the direct outputs 70,71,72 and 73 of the sequencer 9. The gates of the transistors constituting the switches 28,29,30 and 31 respectively represent their control inputs 32,33,34 and 35 and are respectively connected to the direct outputs 73,72,71 and 70 of the sequencer 9.

Figure 4:
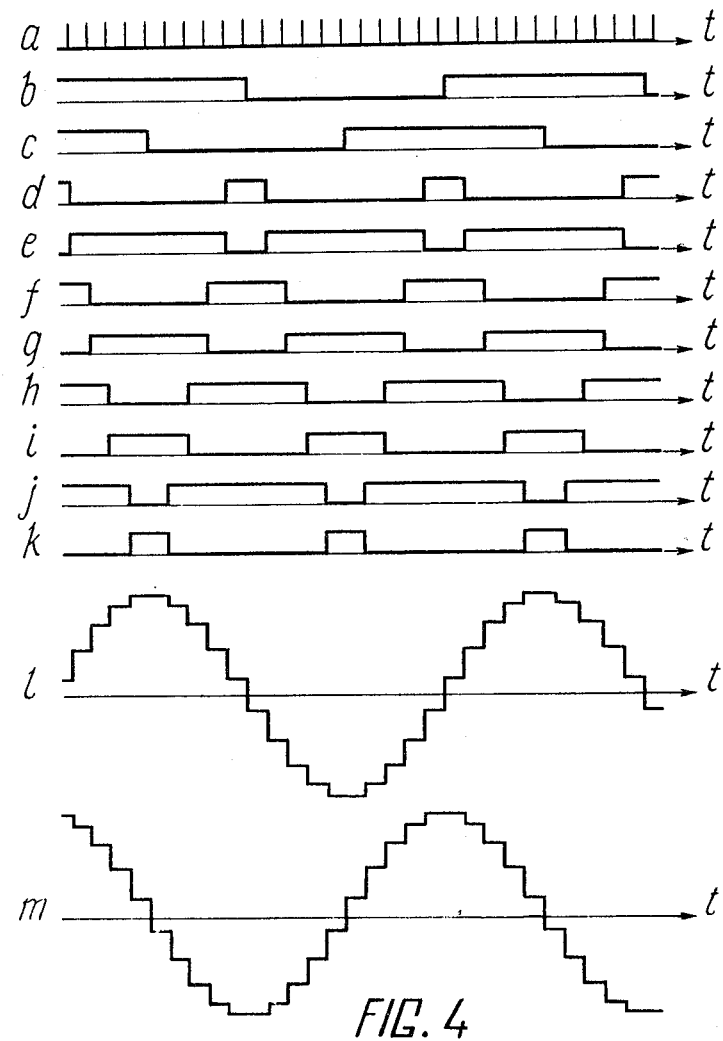
FIG. 4(a–m) are graphs, showing variations of the binary signals controlling the operation of the frequency converter, as well as variations of the converter gains.

The operation of the frequency converter is described with reference to the graphs shown in FIG. 4, wherein FIG. 4a shows the clock pulses produced at the output of the generator 54, FIGS. 4b and 4c respectively show variations of the binary signals at the outputs 69 and 78 of the sequencer 9, FIGS. 4d and 4e respectively show variations of the binary signals at the outputs 70 and 74 of the sequencer 9, FIGS. 4f and 4g respectively show variations of the binary signals at the outputs 71 and 75 of the sequencer 9, FIGS. 4h and 4i respectively show variations of the binary signals at the outputs 72 and 76, FIGS. 4j and 4k respectively show variations of the binary signals at the outputs 73 and 77, and FIGS. 4l and 4m respectively show variations of the gains for the signals transmitted from the input 1 to the output 3 and from the input 2 to the output 4. The signals to be converted are applied to the inputs 1 and 3 (FIGS. 1–3).

The frequency converter shown in FIG. 1 operates as follows.

Let the signals at the outputs of the flip-flops 49 and 50 and at the direct outputs of the register 48, i.e. at the outputs 69–73 and 78 of the sequencer 9, in the initial state be logical ones, i.e. have positive potentials. Then the signals at the inverted outputs of the register 48, i.e. at the outputs 74–77 of the sequencer 9, are logical zeroes, i.e. have zero potentials. In such a case the transistors constituting the switches 15–18 are turned off because their gates are supplied with positive potentials, and the gain of the circuit 5 is determined by the resistance of the resistor 10 and has a minimum value so that the gain for the signal transmitted from the input 1 to the output 3 has a minimum absolute value. The control input 41 of the sign reversing circuit 7, and hence the gate of the transistor constituting the switch 40, is supplied with a positive potential so that said transistor is turned off and the gain for the signal transmitted from the input 1 to the output 3 has a positive sign. The transistors constituting the switches 28–31 are turned on because their gate potentials are zeroes, and the gain of the circuit 6 is determined by the resistance of the resistors 23–27 connected in parallel and has a maximum value so that the gain for the signal transmitted from the input 2 to the output 4 has a maximum absolute value. The control input 47 of the sign reversing circuit 8, and hence the gate of the transistor constituting the switch 46, is supplied with a positive potential so that said transistor is turned off and the gain for the signal transmitted from the input 2 to the output 4 has a positive sign. The signals of logical one from the outputs of the flip-flops 49 and 50 are applied to the inputs of the Exclusive OR circuit 53, as a result of which the latter develops an output signal of logical zero which passes to one of the inputs of the NAND gate 51, to the control input 67 of the register 48 and to one of the inputs of the OR gate 52. The other inputs of the gates 51 and 52 are supplied with the signals of logical one from the outputs of the corresponding stages of the register 48, as a result of which the gates 51 and 52 develop output signals of logical one which pass to the control inputs 56 and 57 of the flip-flops 49 and 50.

Upon application of a clock pulse (FIG. 4a) from the output of the generator 54 (FIG. 1) to the clock inputs 55 and 58 of the flip-flops 49 and 50 and to the clock input 68 of the register 48, the states of the flip-flops 49 and 50, and hence the signals at the outputs 69 and 78 of the sequencer 9, do not change because the control inputs 56 and 57 of the flip-flops 49 and 50 are supplied with signals of logical one inhibiting change in the states of the flip-flops 49 and 50. In such an event the signal at the output of the register stage 59 representing the output 70 of the sequencer 9 will correspond to the signal at the input 63, i.e. will be logical zero (FIG. 4d), because the application of the signal of logical zero to the control input 67 (FIG. 1) causes the information in the register 48 to shift in the direction from the stage 59 to the stage 62. The signal at the other output of the stage 59 representing the output 74 of the sequencer 9 will be logical one (FIG. 4e). The signals at the other outputs of the register 48 (FIG. 1), i.e. at the outputs 71-73 and 75-77 of the suquencer 9, in this case do not change.

The change in the signals at the outputs 70 and 74 turns on the transistor constituting the switch 15 of the circuit 5 and turns off the transistor constituting the switch 31 of the circuit 6 whereby the gain for the signal transmitted from the input 1 to the output 3 increases by a value determined by the resistance of the resistor 11, and the gain for the signal transmitted from the input 2 to the output 4 decreases by a value determined by the resistance of the resistor 27 as shown in FIGS. 4l and 4m. The change in the signal at the direct output of the stage 59 (FIG. 1) leads to a change in the signal at the input of the NAND gate 51 connected thereto, which, however, will produce no change in the signal at the control input 56 of the flip-flop 49 because the other input of the NAND gate 51 is still supplied with the signal of logical zero from the output of the Exclusive OR circuit 53.

The application of the next three clock pulses from the output of the generator 54 leads to a change in the binary signals first at the outputs of the register stage 60 representing the outputs 71 and 75 of the sequencer 9, then at the outputs of the stage 61 representing the outputs 72 and 76, and then at the outputs of the stage 62 representing the outputs 73 and 77, with the result that the signals at the outputs 71-73 will be logical zeroes and the signals at the outputs 75-77 will be logical ones as shown in FIGS. 4f,4g,4h,4i,4j and 4k. The change in the signals at the outputs 71 and 75 (FIG. 1) turns on the transistor constituting the switch 16 and turns off the transistor constituting the switch 30 whereby the gain for the signal transmitted from the input 1 to the output 3 increases by a value determined by the resistance of the resistor 12 and the gain for the signal transmitted from the input 2 to the output 4 decreases by a value determined by the resistance of the resistor 26. The change in the signals at the outputs 72 and 76 turns on the transistor constituting the switch 17 and turns off the transistor constituting the switch 29 whereby the gain for the signal transmitted from the input 1 to the output 3 increases by a value determined by the resistance of the resistor 13 and the gain for the signal transmitted from the input 2 to the output 4 decreases by a value determined by the resistance of the resistor 25. The change in the signals at the outputs 73 and 77 turns on the transistor constituting the switch 18 and turns off the transistor constituting the switch 28 whereby the gain for the signal transmitted from the input 1 to the output 3 increases by a value determined by the resistance of the resistor 14 and the gain for the signal transmitted from the input 2 to the output 4 decreases by a value determined by the resistance of the resistor 24. As this takes place, the gain for the signal transmitted from the input 1 to the output 3 reaches its maximum positive value determined by the resistance of the parallel-connected resistors 10-14 and the gain for the signal transmitted from the input 2 to the output 4 reaches its minimum value determined by the resistance of the resistor 23 as shown in FIGS. 4l and 4m.

The appaearance of the signal of logical zero at the direct output of the register stage 62 (FIG. 1) leads to a change in the output signal of the OR gate 52, which in that case is logical zero because both the inputs of the gate 52 are supplied with signals of logical zero. As a result, the application of the next clock pulse from the output of the generator 54 causes the flip-flop 50 to reverse its state and to produce at its output representing the output 78 of the sequencer 9 a signal of logical zero because the control input 57 of the flip-flop 50 is supplied in this case with a signal of logical zero permitting change in the state of the flip-flop 50. The signal of logical zero from the output of the flip-flop 50 passes to the control input 47 of the sign reversing circuit 8 turning on the transistor constituting the switch 46 whereby the sign of the gain for the signal transmitted from the input 2 to the output 4 is reversed and becomes negative as shown in FIG. 4m. The signal of logical zero from the output of the flip-flop 50 (FIG. 1) passes also to the input of the Exclusive OR circuit 53 bringing about changes in the signals at its output and at the inputs of the gates 51 and 52 connected thereto, as well as at the control input 67 of the register 48, with the result that said inputs are supplied with signals of logical. The control input 57 of the flip-flop 50 in that case is again supplied from the OR gate 52 with a signal of logical one which prevents the flip-flop 50 from changing its state. The signal at the output of the NAND gate 51 does not change because one of its inputs is supplied with the signal of logical zero from the output of the register stage 59.

The application of the next clock pulse from the generator 54 leads to appearance of a signal of logical one at the direct output of the register stage 62, i.e. at the output 73 of the sequencer 9, and of a signal of logical zero at the inverted output of the stage 62, i.e. at the output 77 of the sequencer 9, because the appearance of the signal of logical one at the control input 67 of the register 48 reverses the direction of shift in the register 48 as a result of which the signal of logical one from the source 66 passes to the direct output of the stage 62. The change in the signals at the outputs 73 and 77 turns off the transistor constituting the switch 18 and turns on the transistor constituting the switch 28 whereby the gain for the signal transmitted from the input 1 to the output 3 decreases by a value determined by the resistance of the resistor 14 and the negative value of the gain for the signal transmitted from the input 2 to the output 4 increases by a value determined by the resistance of the resistor 24.

The application of the next three clock pulses leads to appearance of signals of logical ones at the outputs 72,71 and 70 and of the signals of logical zero at the outputs 76,75 and 74 whereby the transistors of the switches 17,16 and 15 are successively turned off, with the result that the gain for the signal transmitted from the input 1 to the output 3 successively decreases by values determined by the resistances of the resistors 13,12 and 11; and, whereby the transistors of the switches 29,30 and 31 are successively turned on, with the result that the negative value of the gain for the signal transmitted from the input 2 to the output 4 successively increases by values determined by the resistances of the resistors 25,26 and 27. As this takes place, the gain for the signal transmitted from the input 1 to the output 3 again reaches its minimum positive value determined by the resistance of the resistor 10, while the gain for the signal transmitted from the input 2 to the output 4 again reaches its maximum absolute value determined by the resistance of the parallel-connected resistors 23–27 but has a negative sign, as shown in FIGS. 4*l* and 4*m*.

The appearance of the signal of logical one at the direct output of the register stage 59 (FIG. 1) leads to a change in the output signal of the NAND gate 51, which in that case is logical zero because both the inputs of the gate 51 are supplied with signals of logical unit. As a result, the application of the next clock pulse from the output of the generator 54 causes the flip-flop 49 to reverse its state and to produce at its output, representing the output 69 of the sequencer 9, a signal of logical zero because the control input 56 of the flip-flop 49 is supplied in this case with a signal of logical zero permitting change in the state of the flip-flop 49. The signal of logical zero from the output of the flip-flop 49 passes to the control input 41 of the sign reversing circuit 7 turning on the transistor constituting the switch 40 whereby the sign of the gain for the signal transmitted from the input 1 to the output 3 is reversed and becomes negative as shown in FIG. 4*l*.

The appearance of the signal of logical zero at the output of the flip-flop 49 (FIG. 1) leads to a next change in the output signal of the Exclusive OR circuit 53, which becomes again logical zero ensuring application of the inhibiting signal to the control input 56 of the flip-flop 49 from the output of the NAND gate 51 and reversing the direction of information shift in the register 48. The application of the next four clock pulses leads to a stepped increase in the absolute value of the gain for the signal transmitted from the input 1 to the output 3 to its maximum value and to a stepped decrease in the absolute value of the gain for the signal transmitted from the input 2 to the output 4 to its miminum value as was described above. In this case, however, both the gains will have negative signs as shown in FIGS. 4*l* and 4*m*. The application of the next clock pulse leads to a change in the value of the binary signal at the output of the flip-flop 50 (FIG. 1) and at the control input 67 of the register 48, whereupon, as the next clock pulses are applied, the binary signals at the outputs of the register stages 62,61, 60 and 59 successively change their values, with the result that the gain for the signal transmitted from the input 1 to the output 3 changes in steps to its minimum negative value and the gain for the signal transmitted from the input 2 to the output 4 changes in steps to its maximum positive value. The application of the next clock pulse leads to a change in the binary signal at the output of the flip-flop 49, with the result that the sequencer 9 returns to the state at which the signals at its outputs 69–73 and 78 are logical ones, which condition corresponds to the beginning of a new cycle of operation of the frequency converter, said new cycle completely repeating the previous cycle described above.

The resistances of the resistors 10–14, determining the values by which the gains for the signal transmitted from the input 1 to the output 3 changes upon variations in the binary signals at the control inputs of the variable-gain circuit 5 and at the control input 41 of the sign reversing circuit 7, are chosen so as to ensure variation of said gain with time according to a stepped sine wave wherein the harmonic components of the lower orders are effectively suppressed. The resistances of the resistors 23,24,25,26 and 27 are respectively proportional to the resistances of the resistors 10,11,12,13 and 14 so that the values by which the gain for the signal transmitted from the input 2 to the output 4 changes upon variation in the binary signals at the control inputs of the variable-gain circuit 6 are proportional to the values by which the gain for the signal transmitted from the input 1 to the output 3 changes upon variations in the binary signals at the control inputs of the circuit 5 corresponding to the control inputs of the circuit 6, i.e. at the control inputs 19,20,21 and 22, respectively.

In the course of switching of the switches 15–18 and 28–31 the control input 19 of the switch 15 is the first-in-order control input of the variable gain circuit 5 at which the change in the binary signal producing an increase in the gain absolute value occurs following a change in the binary signal at the control input 41 of the sign reversing circuit 7, a change in the binary signal at the control input 19 in the opposite direction occurring before the next change in the binary signal at the control input 41. The control inputs 20,21 and 22 of the switches 16,17 and 18 respectively represent the second-, third- and fourth-in-order control inputs of the circuit 5 at which changes in the binary signals in the direction providing increase in the gain absolute value occur following a change in the binary signal at the control input 41, while changes in the binary signals at the second-, third- and fourth-in-order control inputs of the circuit 5 in the direction providing decrease in the gain absolute value occur before the similar changes in the binary signals at the first-, second- and third-in-order control inputs of the circuit 5, respectively. The instant of change in the binary signal at the control input 32 of the switch 28 representing the control input of the circuit 6 corresponding to the first-in-order control input of the circuit 5 is detemined by the instant of change in the binary signal at the inverted output 77 of the sequencer 9, i.e. at the inverted output of the register stage 62, and thus coincides to a high degree of accuracy with the instant at which the binary signal at the fourth-in-order control input of the circuit 5 is changed due to a change in the binary signal at the direct output 73 of the sequencer 9, i.e. at the direct output of the same register stage 62. Likewise, the instants of changes in the binary signals at the control inputs 33,34 and 35 of the switches 29,30 and 31 representing the control inputs of the circuit 6 corresponding to the second-, third- and fourth-in-order control inputs of the circuit 5 will coincide to a high degree of accuracy with the instants of changes in the binary signals at the third-, second- and first-in-order control inputs of the circuit 5, respectively, because the signals to the control inputs 21,20 and 19 are respectively supplied from the direct outputs of the register stages 61, 60 and 59 and the signals to the control inputs 33, 34 and 35 are respectively supplied from the inverted outputs of the same stages. During variation of the control signals the instants of changes in the binary signals at the control inputs 32,33,34 and 35 of the switches 28,29,30 and 31 of the circuit 6 in a direction providing a change in the absolute value of the gain for the signal transmitted from the input 2 to the output 4 in one sense will respectively coincide with the instants of changes in the binary signals at the control inputs 22, 21,20 and 19 of the switches 18,17,16 and 15 of the circuit 5 in a direction providing a change in the absolute value of the gain for the signal transmitted from the input 1 to the output 3 in the opposite sense. As a result, the graph characterizing variation of the gain for the signal transmitted from the input 2 to the output 4 will represent a stepped sine wave which has the same waveform as the graph characterizing variation of the gain for the signal transmitted from the input 1 to the output 3 but which is accurately shifted in phase by 90° with respect to the latter graph.

It will readily be seen that, with each of the variable-gain circuit 5 and 6 comprising the same number of switches, a highly accurate phase shift between the gains can be ensured irrespective of the number of switches employed provided that the instant at which the binary signal at the control input of the circuit 6 corresponding to the "k"th-in-order control input of the circuit 5 changes in a direction providing a change in the gain absolute value in one sense coincides with the instant at which the binary signal at the $(N-k+1)$th-in-order control input of the circuit 5 changes in a direction providing a change in the gain absolute value in the opposite sense, where N is the number of switches in each of the circuits. If the frequency converter is designed as shown in FIG. 1, so that changes in the same directions in the binary signals at the control inputs of different variable-gain circuits produce changes in the same directions in the absolute values of the corresponding gains, a highly accurate phase shift is ensured by applying to the control input of the circuit 6 corresponding to the "k"th-in-order control input of the circuit 5 a binary signal inverted in relation to the binary signal applied to the $(N-k+1)$th-in-order control input of the circuit 5. For this purpose the "k"th-in-order control input of the circuit 5 should be connected to the direct output of the register stage which is "k"th in order counting from one of the end stages, and the control input of the circuit 6 corresponding to the "k"th-in-order control input of the circuit 5 should be connected to the inverted output of the register stage which "k"th in order counting from the other end stage.

If the circuits 5 and 6 comprise switches having each two control inputs which operate in antiphase, as shown in FIG. 2, then at the time of switching of each of the switches 15-18 and 28-31 the binary signal at its additional control input should change in the direction opposite to that of the change in the binary signal at its other control input. For instance, when the switch 15 is opened to disconnect the resistor 11, its additional control input 79 is supplied with a signal of logical zero simultaneously with application of a signal of logical one to its control input 19, as a result of which the first transistor connected in series with the resistor 11 is turned off and the second transistor connected between the resistor 11 and the ground is turned on ensuring removal of the input signal from the first transistor. This makes possible switching of an input signal having a potential exceeding the potential of the control signal applied to the gate of the first transistor. When the switch 15 is closed to connect the resistor 11, its control input 19 is supplied with a signal of logical zero and its additional control input 79 is supplied with a signal of logical one. The application of control signals to the control inputs 20 and 80, 21 and 81, 22 and 82, 32 and 83, 33 and 84, 34 and 85, 35 and 86 of the switches 16,17,18,28,29,30 and 31 is carried out in the same manner. The process of variation of the binary control signals at the control inputs 19-22 and 32-35, as well as at the control inputs 41 and 47, does not differ from the process of variation of the signals at these control inputs in the frequency converter shown in FIG. 1. In the converter shown in FIG. 2, however, a change in the binary signal applied to the control input 19,20,21 or 22 from the corresponding direct output 70,71,72 or 73 of the sequencer 9 is accompanied by a change in the opposite direction in the binary signal respectively applied to the additional control input 79,80,81 or 82 from the inverted output 74,75,76 or 77. Likewise, a change in the binary signal applied to the control input 32,33,34 or 35 from the corresponding inverted output 77,76,75 or 74 of the sequencer 9 is accompanied by a change in the opposite direction in the binary signal respectively applied to the additional control input 83,84,85 or 86 from the direct output 73,72,71 or 70 of the sequencer 9. The switching of the switches 15-18 and 28-31 in this case is carried out in the same sequence as in the converter shown in FIG. 1.

If each of the variable-gain circuits 5 and 6 in the converter shown in FIG. 2 comprises N switches, they should be connected so that the additional control input of the switch whose other control input is the "k"-th-in-order control input of the circuit 5 is connected to the output of the sequencer 9 connected to the control input of the circuit 6 corresponding to the $(N-k+I)$th-in-order control input of the circuit 5, and the additional control input of the switch whose other control input is a control input of the circuit 6 corresponding to the "k"th-in-order control input of the circuit 5 is connected to the output of the sequencer 9 connected to the $(N-k+I)$th-in-order control input of the circuit 5. For this purpose the additional control input of each of the switches in the circuit 5 should be connected to the inverted output of the register stage, the direct output of which is connected to the other control input of this switch and, the additional control input of each of the switches in the circuit 6 should be connected to the direct output of the register stage, the inverted output of which is connected to the other control input of this switch.

If the switches of the circuits 5 and 6 comprise transistors of different types of conductivity, as shown in FIG. 3, the sequencer 9 is arranged to develop at its outputs 70-73 bipolar binary signals, a signal of positive potential corresponding to logical one, while a signal of negative potential corresponds to logical zero. In this case logical signals at the outputs 69-73 of the sequencer 9 are developed in the same sequence as in the frequency converter shown in FIG. 1. To provide development of bipolar binary signals the source (not shown) that supplies power to the circuits of the sequencer 9 (FIG. 3) should be a bipolar source having its neutral point connected to the ground.

In the course of operation of the frequency converter shown in FIG. 3 application of negative signals of logical zero to the control inputs 19-22 of the switches 15-18 turns on the transistors constituting these switches, while application of positive signals of logical unit to the control inputs 19-22 turns off said transistors so that the switching of the switches 15-18 proceeds in the same sequence as in the frequency converter shown in FIG. 1. Simultaneously with the application of a positive signal of logical one to the control input 19 of the switch 15 (FIG. 3) the same signal is applied to the control input 35 of the switch 31 turning on the transistor constituting the switch 31. A negative signal of logical zero applied to the control input 19 of the switch 15 is simultaneously applied also to the control input 35 of the switch 31 turning off the transistor constituting the switch 31. Likewise, changes in the binary signals at the control inputs 19,20 and 21 are accompanied by changes in the same directions in the binary signals at the control inputs 37,36 and 35, respectively, causing the transistors constituting the switches 30,29 and 28 to turn on as the transistors constituting the switches 16,17 and 18 are turned off, and to turn off as the latter transistors are turned on. Therefore changes in the binary signals at the control inputs 19, 20,21 and 22 producing increase or decrease in the absolute value of the gain for the signal transmitted from the input 1 to the output 3 are respectively accompanied by changes in the same direction in the binary signals at the control inputs 35,34,33 and 32, the latter changes, however, bringing about changes in the opposite sense in the absolute value of the gain for the signal transmitted from the input 2 to the output 4. If the resistances of the resistors 10-14 and 23-27 are chosen as described above, the graphs characterizing variations of the gains for the signals transmitted from the input 1 to the output 3 and from the input 2 to the output 4 will represent stepped sine waves which are out of phase by 90°. Since the signals to the control inputs of the circuits 5 and 6 are supplied from the same outputs 70-73 of the sequencer 9, changes in the binary signals at the control inpurs of different circuits 5 and 6 take place simultaneously ensuring a highly accurate phase shift between the gains.

If each of the variable-gain circuits 5 and 6 in the converter shown in FIG. 3 comprises N switches, they should be connected so that the control input of the circuit 6 corresponding to the "k"th-in-order control input of the circuit 5 is connected to the output of the sequencer 9 connected to the $(N-k+1)$th-in-order control input of the circuit 5.

It is to be understood that the invention is not limited to the particular arrangements described above and various modifications may be made without departing from the scope of this invention. For example, the variable-gain circuits 5 and 6 (FIGS. 1-3) may be constituted by various circuits capable of changing their gains by predetermined values in response to changes in the binary signals applied to their control inputs. Such circuits may comprise, for example, variable attenuators or summing amplifiers. The controlled electronic switches 15-18 and 28-31 may be constituted by various types of transistors or integrated circuits capable of passing or blocking an electrical signal in response to control signals applied thereto. The variable-gain circuits 5 and 6 may be respectively connected to the outputs of the sign reversing circuits 7 and 8, in which case the inputs of the circuits 7 and 8 will constitute the inputs of the frequency converter. The sequencer 9 may comprise various logic elements capable of providing the required sequence of changes in the binary signals at its outputs. The circuits connected between the output of the Exclusive OR circuit 53 (FIG. 1) and the control inputs of the flip-flops 49 and 50 may be various logic gates capable of multiplying or adding logical signals so as to provide application of a permitting signal from the output of a logic gate to the control input of the flip-flop connected thereto when the binary signal at the output of the register end stage connected to that logic gate is determined by the signal at the input of the other end stage of the register and the signal at the output of the Exclusive OR circuit 53 corresponds to the direction of shift towards the end stage whose output is connected to this logic gate. For example, the OR gate 52 may be substituted by a NAND gate having its inputs respectively connected to the inverted outputs of the Exclusive OR circuit 53 and of the register stage 62. Likewise, the NAND gate 51 may be substituted by an OR gate.

COMMERCIAL APPLICABILITY

The proposed frequency converter may be used in quadrature harmonic oscillators, in synchronous detectors and in devices for measuring the phase of an electrical signal against the background of noise, as well as in other devices in which the input signal should be converted to two output signals proportional to the amplitudes of the input signal components having a predetermined frequency and shifted in phase with respect to each other by 90°.

If the frequency converter is used for generating harmonic oscillations, the inputs of the converter are supplied with direct voltage. In such a case the converter develops at its outputs voltages varying in the manner of stepped sinusoids and shifted in phase with respect to each other by 90°.

If the frequency converter is used for synchronous detection of the input signal, the latter is applied to the inputs of the converter, the signals from the outputs of the converter being supplied to the inputs of low-pass filters. The frequency and phase of the synchronizing signals which control variations of the converter gains are adjusted so as to maintain the signal at the output of one of the low-pass filters close to zero. The signal derived from the output of the other low-pass filter in this case is proportional to the input signal component having the same frequency and phase as the curve characterizing variation with time of the gain for the signal transmitted from the input of the converter to its output connected to this low-pass filter, which makes possible measurement of the signal value at small signal-to-noise ratios.

If the frequency converter is used for measuring the phase of the input signal, the latter is applied to one of the inputs of the converter, while its other inputs is supplied with a reference signal. The frequency and phase of the reference signal determine the frequency and phase of the synchronizing pulses which control variations of the converter gains. In this case the outputs of the converter are connected to the inputs of low-pass filters, one of which develops at its output a signal corresponding to the amplitude of the input signal component which is in phase with the reference signal, while the other filter develops at its output a signal corresponding to the amplitude of the input signal component shifted in phase with respect to the reference signal by 90°.

We claim:

1. A quadrature stepwave frequence converter comprising a two-output device having a plurality of control inputs for changing the gains for the signals transmitted from its inputs to its outputs upon a change in the values of the binary signals at the control inputs, and a sequencer having its outputs connected to the control inputs of the two-output device for applying binary signals to said control inputs so as to vary the gain for the signal transmitted from the input of the two-output device to its one output according to a step variable function approximating a sine wave and to vary the gain for the signal transmitted from the input of the device to its other output according to a step variable function approximating a cosine wave, wherein the improvement comprises said two-output device comprising first and second variable-gain circuits, each having N control inputs forming a separate group of the control inputs of the device and respectively corresponding to the control inputs of the other variable-gain circuit for changing the absolute value of the gain for the signal transmitted from a first input of the device to a first output upon a change in the value of the binary signal applied to a control input of said first variable-gain circuit and the absolute value of the gain for the signal transmitted from a second input of the device to a second output upon a change in the value of the binary signal applied to a control input of the second variable-gain circuit so that a change in the value of the binary signal applied to a control input of a variable-gain circuit produces a change in the absolute value of the corresponding gain by a predetermined value corresponding to this control input and in a direction determined by the direction of the change in the binary signal and so that changes in the binary signals applied to the control inputs of one variable-gain circuit produce changes in the corresponding gain which are proportional to the changes in the other gain produced by changes in the binary signals at the corresponding control inputs of the other circuit; and first and second sign reversing circuits, said first sign reversing circuit being connected to said first variable-gain circuit and the second sign reversing circuit being connected to the second variable-gain circuit, each of the sign reversing circuits having a control input forming another control input of the two-output device for reversing upon a change in the value of the binary signal at the control input of the sign reversing circuit the sign of the gain, the absolute value of which is varied by means of the variable-gain circuit connected to this sign reversing circuit; wherein the sequencer has first and second sign control outputs, said first sign control output being connected to the control input of said first sign reversing circuit and the second sign control output being connected to the control input of the second sign reversing circuit for applying to said control inputs binary signals each changing its value at regular intervals and which are shifted in phase with respect to each other by 90°, and a plurality of gain value control outputs connected to the control inputs of the variable-gain circuits for changing the value of the binary signal applied to each of the control inputs of said first variable-gain circuit first in a direction providing an increase in the gain absolute value and then in a direction providing a decrease in the gain absolute value during each time period between two successive changes in the binary signal at the control input of the first sign reversing circuit connected to the first variable-gain circuit so that a change in the binary signal at each next-in-order control input of said first variable-gain circuit in a direction providing an increase in the gain absolute value occurs after a change in a similar direction in the binary signal at the preceding-in-order control input of said first variable-gain circuit (5), a change in the binary signal in a direction providing a decrease in the gain absolute value occurs before a change in a similar direction in the binary signal at the preceding-in-order control input of said first variable gain circuit, and for changing the binary signals applied to the control inputs of the second variable gain circuit so that the instant of change in the value of the binary signal at that control input of the second variable-gain circuit which corresponds to the "k"th-in-order control input of the first variable gain circuit in a direction providing a change in the gain absolute value in one sense coincides with the instant of change in the value of the binary signal at the (N−k+I)th-in-order control input of the first variable gain circuit in a direction providing a change in the gain absolute value in the opposite sense.

2. A quadratue stepwave frequency converter according to claim 1, wherein each of the variable-gain circuits comprises N controlled two-position electronic switches, each having a control input to change its position upon a change in the value of the binary signal at its control input, the control inputs of the switches of each variable-gain circuit being respectively the control inputs of the respective variable-gain circuit, each of the switches changing upon a switching of the absolute value of the corresponding gain by a value corresponding to the variable-gain circuit control input which is the control input of this switch and changes in the same directions in the values of the binary signals at the control inputs of the switches of different circuits produce changes in the same directions in the absolute values of the corresponding gains; and wherein the sequencer has N direct gain value control outputs respectively connected to the inputs of the first variable-gain circuit and N inverted gain value control outputs respectively connected to the control inputs of the second variable-gain circuit, the control input of the second variable-gain circuit corresponding to the "k"th-in-order control input of the first variable-gain circuit being supplied with a binary signal inverted in relation to the binary signal supplied to the (N−k+I)th-in-order control input of the first variable-gain circuit.

3. A quadrature stepwave frequency converter according to claim 2, wherein each of the switches has an additional control input for application of a binary signal thereto which is inverted in relation to the binary signal applied to the first control input, the additional control inputs of the switches being connected to the outputs of the sequencer, the additional control input of the switch, the other control input of which is the "k"th-in-order control input of the first variable-gain circuit, being connected to the sequencer output connected to the control input of the second variable-gain circuit corresponding to the (N−k+I)th-in-order control input of the first variable-gain circuit, and the additional control input of the switch, the other control input of which is the control input of the second variable-gain circuit corresponding to the "k"th-in-order control input of the first variable-gain circuit, being connected to the sequencer output connected to the (N−k+I)th-in-order control input of the first variable-gain circuit.

4. A quadrature stepwave frequency converter according to claim 1, wherein each of the variable-gain circuits comprises N controlled two-position electronic switches, each having a control input to change its position upon a change in the value of the binary signal at its control input, the control inputs of the switches of each variable-gain circuit being respectively the control inputs of the respective variable-gain circuit, each of the switches changing upon a switching of the absolute value of the corresponding gain by the value corresponding to the variable-gain circuit control input of this switch, and changes in the same directions in the values of the binary signals at the control inputs of the switches of different variable-gain circuits produce changes in the absolute values of the corresponding gains in mutually opposite directions; and the sequencer has N gain value control outputs respectively connected to the control inputs of both the variable-gain circuits, the control input of the second variable-gain circuit, corresponding to the "k"th-in-order control input of the first variable-gain circuit, being connected to the sequencer output connected to the $(N-k+1)$th-in-order control input of the first variable-gain circuit.

5. A quadrature stepwave frequency converter according to any one of the claims 1-4, wherein the sequencer comprises first and second flip-flops, each having a clock input, a control input for reversing the state of the flip-flop upon application of a signal to its clock input on condition that the control input is supplied with a permitting signal, and an output; a reversible shift register including a chain of N stages and having first and second information inputs respectively formed by the inputs of the two end stages of the register and supplied with constant signals respectively corresponding to the opposite values of a binary signal, a control input and a clock input for sequentially shifting a signal from one of the end stages to the other end stage in a direction determined by the value of the binary signal at the control input; first and second logic gates having their outputs respectively connected to the control inputs of the first and second flip-flops, said first input of said first logic gate being connected to the output of one end stage of the shift register and said first input of the second logic gate being connected to the output of the other end stage of the shift register; an Exclusive OR circuit having its inputs respectively connected to the outputs of the first and second flip-flops and its output connected to the control input of the shift register for reversing, upon a change in the value of the binary signal at the output of either of the flip-flops, the direction of shift in the shift register towards the end stage, the output of which is connected to the logic gate connected to the other flip-flop; and a clock pulse generator having its output connected to the clock inputs of the first and second flip-flops and of the register; wherein the second input of each logic gate is connected to the output of the Exclusive OR circuit for applying a permitting signal to the control input of the flip-flop connected to the respective logic gate when the value of the binary signal at the output of the register and stage connected to this logic gate is determined by the binary signal at the input of the other end stage and the signal at the output of the Exclusiver OR circuit corresponds to the direction of shift in the register towards the end stage, the output of which is connected to that logic gate; the outputs of the first and second flip-flops being respectively the sign control outputs of the sequencer and the outputs of the register stages being respectively the gain value control outputs of the sequencer and being connected to the control inputs of the variable-gain circuits, the "k"th-in-order control input of the first variable-gain circuit being connected to the output of the register stage which is "k"th in order counting from one end stage and the corresponding control input of the second variable-gain circuit is connected to the output of the register stage which is "k"th in order counting from the other end stage.

* * * * *